United States Patent
Oliverio et al.

(10) Patent No.: US 10,324,436 B2
(45) Date of Patent: Jun. 18, 2019

(54) SYSTEM AND METHOD FOR PROGRAMMABLE CONTROL INSTRUMENTS, TEST AND MEASUREMENT HARDWARE CONFIGURATION

(71) Applicant: Keysight Technologies Singapore (Holdings) Pte. Ltd., Minneapolis, MN (US)

(72) Inventors: Nestor Hugo Oliverio, Barcelona (ES); Marc Almendros Parra, Cubelles (ES)

(73) Assignee: Keysight Technologies Singapore (Sales) Pte. Ltd., Singapore (SG)

( * ) Notice: Subject to any disclaimer, the term of this patent is extended or adjusted under 35 U.S.C. 154(b) by 338 days.

(21) Appl. No.: 15/232,775

(22) Filed: Aug. 9, 2016

(65) Prior Publication Data

US 2017/0123394 A1    May 4, 2017

(51) Int. Cl.
    *G05B 19/042*    (2006.01)
(52) U.S. Cl.
    CPC .. *G05B 19/042* (2013.01); *G05B 2219/21109* (2013.01)
(58) Field of Classification Search
    None
    See application file for complete search history.

(56) References Cited

U.S. PATENT DOCUMENTS

| | | |
|---|---|---|
| 7,640,526 B1 | 12/2009 | Blodget et al. |
| 7,902,866 B1 | 3/2011 | Patterson et al. |
| 8,997,033 B1 | 3/2015 | Hew |
| 2003/0038842 A1 | 2/2003 | Peck et al. |
| 2009/0085603 A1* | 4/2009 | Paul ................. H03K 19/17764 326/8 |

FOREIGN PATENT DOCUMENTS

WO    2009033630 A1    3/2009

OTHER PUBLICATIONS

Search Report dated Feb. 23, 2016 in Spanish Application No. 201531184.

* cited by examiner

*Primary Examiner* — Whitney Moore

(57) ABSTRACT

A system of hardware configuration of a programmable control instrument, test and measure that includes an integrated FPGA is disclosed. The FPGA includes a static section comprising at least one static logic FPGA preset; a dynamic section comprising at least one dynamic logic FPGA programmable by a user; and a logical interface that connects the static section and dynamic section.

17 Claims, 3 Drawing Sheets

SYSTEM AND METHOD FOR PROGRAMMABLE CONTROL INSTRUMENTS, TEST AND MEASUREMENT HARDWARE CONFIGURATION

CROSS REFERENCE TO RELATED APPLICATIONS

The present application claims priority under 35 U.S.C. § 119(e) from Spanish Patent Application No. 201531184 filed on Aug. 10, 2015 naming Nestor Hugo Oliverio, et al. as inventors. The entire disclosure of Spanish Patent Application No. 201531184 is specifically incorporated herein by reference.

BACKGROUND

During recent years, the demands placed on the programmable control instruments of control, test or measurement have been increased significantly. They have grown significantly the requirements in term of number of entries and exits, speed acquisition and processing capacity. In addition, the requirement to process a large amount of data in real time, the need to adapt such processing is attached to various specific applications with the same hardware platform and many times in a very short time. FPGA technology ('field-programmable gate arrays', in English 'field') (programmable gate array') provides a very promising alternative to deal with these challenges, given its character, reconfigurable and high processing capacity. However, for implementing the settings needed for the proper operation of the instruments control, test and measurement, so need an advanced knowledge of logical hardware, as highly specialized for FPGA, reaching design tools define physical interconnections and internal signal propagation times. This makes for implementing FPGA-based systems is required subject matter experts and the times of deployment and implementation of these systems are also very long even for expert users. Control, test and measurement systems require the benefits that offer the FPGA but need that its use and implementation is underway fast and simple as possible without forcing the user to be a programming expert hardware.

Some commercial solutions provide hardware that allows applications control, test and measurement that include an FPGA and provide the user a package with a draft framework—framework, English—software tool provided by the manufacturer of the FPGA included in the instrument. This project framework includes the necessary components to interact with the fixed hardware of the computer and the user can modify it to add the features you want. The problem with these systems is that requires experts in FPGA that usually is not the case of the for control, test and measurement engineers, and also development and commissioning times they are very long which much also limits its application to control, test and measurement. In order to simplify the process, there are some graphical tools that allow deploy code more easily FPGA, but not be designed for no instrument specific, still requiring complex interactions for your implementation on hardware of each particular, being typically instrument necessary to resort to the software tools provided by the manufacturer of the FPGA included in the instrument and use some project framework as in the previous case. I.e., These graphical tools do not include native implementation on trade instruments, which is a very complex task and suffers from drawbacks similar to those described for the above solution.

Other solutions provide modular instruments including an FPGA and a specific software to set these instruments, consisting in an environment of graphic programming that adapts a software based programming language in loops, conditionals, etc, to programming FPGA hardware. The graphical tool of high level allows you to simplify the process of programming of the FPGA hardware for the user, but at the expense of a reduction in performance due to a lower chance of optimization compared with a programming made with advanced tools. In addition the mechanism of software hardware-oriented programming presents serious disadvantages that according to the use that the user usually result in a use very deficient of the FPGA.

In all cases mentioned during the customization process of the hardware instrument user FPGA is implemented completely all the logic of the FPGA, and this occurs whenever the user changes any functionality by min that is. This added to the limited capacity of optimization of a user not expert, it seriously compromises the efficiency and performance of functions included in the libraries of the manufacturer and developed additional functions by the user. Also for this reason, times of compilation and implementation of the instrument can be prohibitively long. In short, there is still the need on the State of the art of a method and system hardware configuration of programmable control instruments, test and measure, which allows you to dynamically configure such instruments in a simple way and optimized, without having specific knowledge of FPGA and reducing the wait times associated with changes in the locale.

BRIEF DESCRIPTION OF THE FIGURES

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
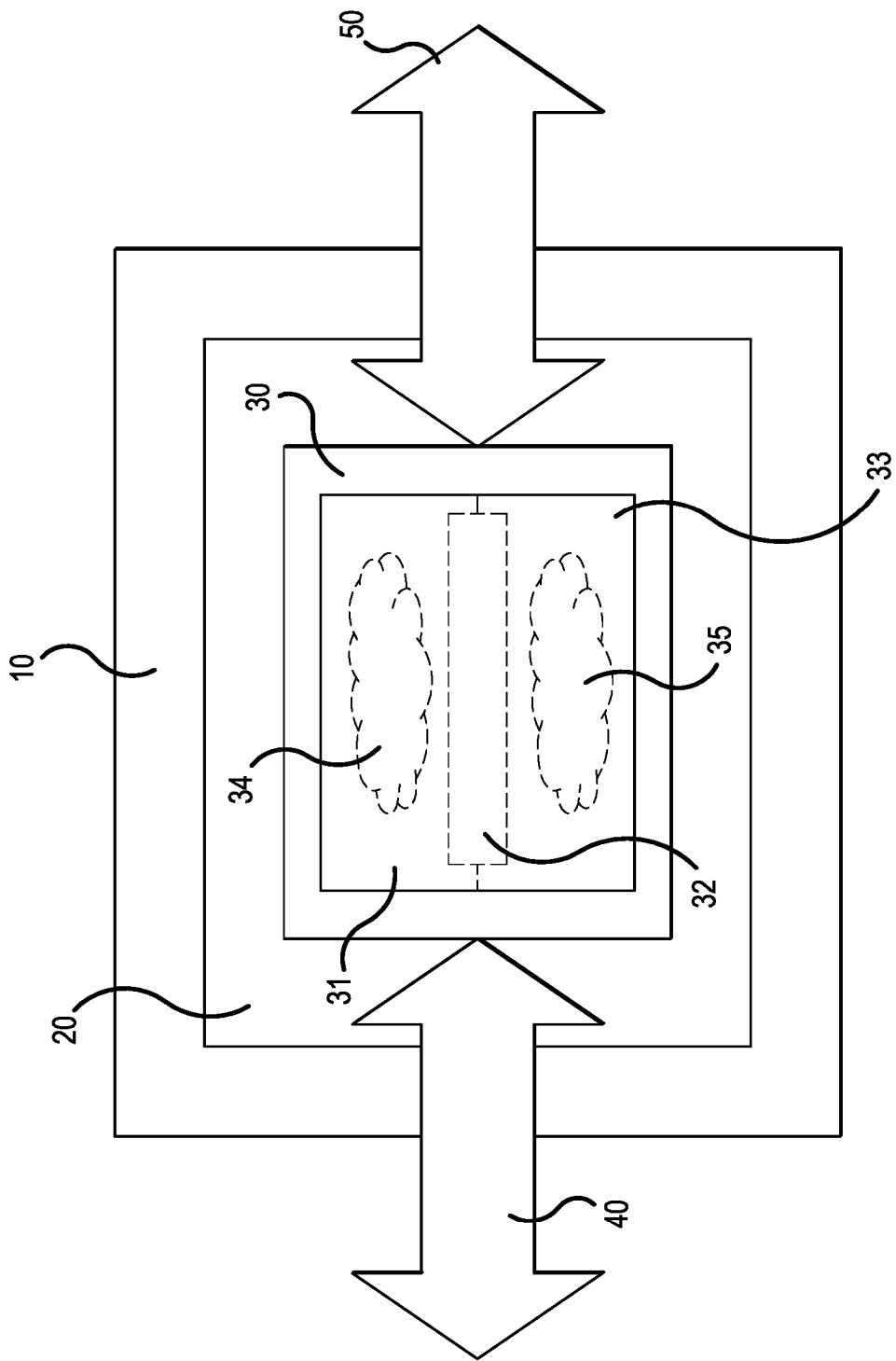
FIG. 1 is a block diagram of the architecture of an instrument according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

In this text, the term "includes" and its derivatives (such as "understanding", etc.) not they must be understood in a limited sense, in other words, these terms should not be interpreted How excluding the possibility that what you described and defined to include more items, stages, etc. Since the implementation of a FPGA process consists in the generation of the information necessary to establish the interconnections and the positioning of the internal logical components of the FPGA, in this text, the term 'FPGA logic' It should be understood as a set of information that defines these interconnections and positions. In particular, and as detailed throughout the description, a 'logic Static FPGA' refers to a set of interconnections and positioning of internal components of the factory implemented default FPGA, while a 'dynamic logic FPGA' refers to a set of interconnections and positioning of FPGA internal components resulting from implementing the user code.

The present invention serves to solve the problem mentioned above, resolving the problems that present the solutions discussed in the State of the technique, using partial reconfiguration of the FPGA that separates: an FPGA logic dynamic programmable by the user and implemented preset static logic FPGA of factory. Both logical are reconfigurable, but static logic develops in factory by experts, while the dynamic is implemented with simplified tools for the final user, who does not need FPGA programming knowledge.

In the context of the invention, defined and used the following concepts:

User code: is the 'high level' source code that implements the user FPGA capabilities to customize the operation of the instrument programmable control, test and measurement FPGA logical: It is the result of the process of implementation of the FPGA code in the FPGA and understands the logic gates and all components inmates who make up the FPGA, its positioning and interconnection within the FPGA.

logic FPGA dynamic: is the result of the implementation of the user code.

Static logic FPGA: logic FPGA preset, developed and implemented factory which may not be modified by the user.

Section static/dynamic: is an area of the FPGA intended to contain the FPGA logic static/dynamic.

A first aspect of the invention presents a system's hardware configuration a programmable control instrument of control, test and measurement, which includes an FPGA integrated in the instrument, providing it with programming skills or dynamic reconfiguration. The FPGA comprises two sections:

- a static section which includes at least one preset static logic FPGA implemented factory. This static logic FPGA can understand features essential instrument whose complexity exceeds the knowledge of an average user, as well as additional functionality which optimization to low level with advanced tools is critical to its correct operation into the FPGA.
- a dynamic section which includes at least one dynamic programmable FPGA logic by the user. Since the user uses the functionality provided by the FPGA of the static section and not logic modifies the static section, it simplifies greatly the implementation of dynamic logic FPGA with new user capabilities. In addition to not modify at all the FPGA logic static in the process of implementation of the dynamic logic FPGA stays the operation optimized factory features regardless of the customizations made by the user. Also, the reprogramming of the dynamic section does not affect the static section of the FPGA, by what logic Static FPGA can continue its operation for reprogramming or logic FPGA dynamic reconfiguration. Preset static logic FPGA determines to turn a fixed logical interface that allows connect any dynamic logic FPGA with static logic FPGA, which makes it to the user make use of the features of factory and interconnecting them with the FPGA logic dynamics developed himself to customize the instrument. Illustratively, the static section can be configured with multiple logics FPGA preset static implemented factory, selectable by the user. Also illustratively, the dynamic section can be configured with multiple logics FPGA interchangeable dynamics during the operation of the static logic FPGA and the rest of the instrument. Also both the dynamic and static sections can be subdivided into subsections static and dynamic respectively, so that any of the subsections can be reconfigured while the others continue to operate. Logics FPGA can be stored in the user's computer or a memory volatile or non-volatile of the same instrument. The exchange between different logics FPGA can be done by indication of the user, or even in an automated manner to meet conditions described by your own programmable code. In addition the FPGA logic can be programmed in non-volatile memory of the module for the configuration of the module automatically in the Boot.

Illustratively, the system includes a user interface for the programming of the dynamic section, i.e., the development of the user code that contains the instructions or functions to customize the instrument of control, test and measurement. Through the user interface, the user enters instructions or high-level functions that are illustratively converted to FPGA logic for dynamic section on a server of implementation. In accordance with preferred options, the server can be integrated in same software along with the user, either be integrated in a software interface separate which can run locally or remotely, providing services of deployment in the cloud. Illustratively, the system comprises one or more static hardware profiles for each instrument. Static hardware profiles consist of a static profile for the user interface and the corresponding static logic FPGA and logical interface. Illustratively the static profile of the user interface consists of a description simplified logic 25 static FPGA associated, formed by blocks that describe the static logic FPGA functionality and include the ports of the logical interface between the logic FPGA static and dynamic. The user interface allows you to select between the static profiles are available for each instrument on which the user performs the programming of new features. Different hardware profiles include features in the static section implemented in factory applications-oriented specific control, test and measurement of the instrument and its complexity by requiring a implementation and optimization performed by experts with advanced tools. Illustratively, the user interface includes in addition to standard buses, buses specifically adapted to the characteristics of the hardware and the data generated by each instrument. The buses are groups of signals and data that allow you to communicate actions or complex data between functions without having to understand or manipulate expressly and individually the data and signals that make up the bus. In addition, the System illustratively comprises at least one library with predefined models that the 5-user can be used for programming the dynamic section.

These libraries as static profiles including natively interfaces master and slave for the bus specific processing and manipulating signals and complex instrument data transparently to the user, in a way that it can schedule new functionality in a simple way, without having to implement complex techniques of processing and management of different signals according to each instrument. Illustratively, the user interface provides additional functionality to the user, such as code validation or calculation of latencies, information that illustratively It is provided to the user during the development of the code. According to options preferential implementation, the user interface can be a graphical interface, a text interface, or an interface that combines both modalities.

A second aspect of the invention is a method of configuration of hardware of a programmable control instrument of control, test and measurement, understanding that instrument an FPGA integrated with a dynamic and a static section connected through a logical interface. The method involves the following steps:

Run dynamic section a logical FPGA dynamic developed by a user. The configuration of the dynamic section according to this logic is independent static section of the FPGA configuration, so it It can be done while the static logic FPGA is still operational. In addition the dynamic section can in turn divided into subsections so that a subsection can be reconfigured while the others are still operating. Illustratively, the dynamic logic FPGA is generated on a server of implementation from user code of high level developed by user through a user interface. The server can run local or remotely according to preferred method options. In addition, the interface It can be graphical, textual, or combine both options, as well as incorporate libraries components preset for the dynamic section. Illustratively, the method can understand to select between a plurality of logics FPGA static preset implemented factory to reset the static section. Note to change between static logic FPGA, called the instrument hardware profiles, involves the reconfiguration of the section static, but being previously implemented in FPGA logic factory, is it minimizes the time that the instrument remains inoperative, at the same time that increases the versatility of the same without compromising its performance or performance Static section can be divided into subsections so that a static subsection can be reconfigured while the others remain operational.

Also illustratively, the method can understand the configuration in the dynamic section of multiple logics FPGA dynamics developed by the user, being these interchangeable logics by explicit instruction of the user or by the own automated behavior of the instrument. These logics can stored in the computer of the user, in a volatile memory of the instrument or in a non-volatile memory of the same instrument for automatic configuration in the boot.

Illustratively, the method includes the use of standard buses and buses specific to each instrument for interconnecting functions using the user, in such a way that complex interconnections are made without the need of know the internal details of signals and data on the bus, i.e. as one only signal. The functions of the libraries and FPGA logic interfaces static include interfaces master and slave for these buses in a way that processed and manipulated these buses of complex data in a transparent manner for the user.

Illustratively, the method includes check in real time during the the validity of connections, allowing only user code programming valid connections and suggesting actions to the controller to perform the connections correctly.

Illustratively, the method comprises also calculate automatically latencies associated with the user code and illustratively show this information during the same development to accelerate the process and simplify a factor very important in FPGA hardware, without any programming simulations or deploy FPGA logic and run it in hardware, processes that they usually require quite some time above all the implementation.

Illustratively, the method comprises locally validate the programmable code developed prior to the implementation phase of the dynamic logic FPGA which often require a significant time. In other words, own design software It allows you to validate the code developed by the user to verify parameters General operation, interconnections between user roles and with the static logic FPGA resources used and other parameters that allow detection of problems at an early stage before the implementation in FPGA.

Method and system of the invention achieved independence the generation stage of the FPGA hardware of user or dynamic logic FPGA, of the preset static logic FPGA factory which provides the essential capabilities to implement core functions, on which the user develops the application. Thus is they deploy and optimize separate preset static logic FPGA of factory and the FPGA dynamic logic user, since the logic of static factory is not modified during the customization of the module by the user. This allows to reduce significantly time and difficulty of implementation of FPGA dynamic logic developed by the user, which as a result can be developed with simplified tools usable by users with no programming experience of FPGA. While at the same time ensures that in the process of personalization of the instrument factory capabilities will not be affected during the implementation of the logic dynamic FPGA. The FPGA logic of factory provides the essential features of the module, as well as important complex additional functionality for certain application of the instrument, which are developed and optimised in the factory with complex techniques and advanced low level tools that allow you to use very efficient FPGA resources and achieve maximum performance, without which many of these very demanding features can not be implemented. In addition, the estaticodinamico separation keeps static logic FPGA completely protected and hidden from the user, while safeguarding the know-how of developers.

Finally, the use of partial reconfiguration of FPGA for dynamic or static section It allows the user to reprogram the FPGA part while other parts remain working in the application, and even that part of the system hardware trigger the reconfiguration of itself or elsewhere.

FIG. 1 depicts a programmable control instrument (10) control, test and measurement instrument that particular implementations of the method and system of the invention are applied. In one implementing preferential, programmable control instrument (10) is a modular instrument of a platform PXI express ("PCI eXtensions for Instrumentation") or PCI ("Peripheral Component Interconnect Express"), although there may be implementations at any platform for control, test and measurement instruments compatible with FPGA technology. The programmable control instrument (10) comprises a fixed hardware (20) run by an FPGA (30). The FPGA (30) comprises one or more ports of entry and/or exit (50), as well as a bus communication (40), which can be accompanied as well as ports for any another signal required by the FPGA (30), as for example signals clock, etc. Notably, the method and system of hardware configuration of the programmable control instrument (10) act only on the FPGA (30), and therefore independently from the rest of components of the programmable control instrument (10). The FPGA illustratively includes a static section (31) and a dynamic section (33), connected to through a logical interface (32). Static section (31) includes static logic FPGA (34) implemented and optimized factory, while the dynamic section (33) includes dynamic logic FPGA (35) programmable by the user. The static logic FPGA (34) comprising the essential features (i.e., core functions) the instrument and those whose implementation low level and advanced optimization are useful to the operation of the programmable control instrument (10).

More generally, the programmable control instrument (10) can be implemented in numerous ways (e.g., such as with dedicated hardware) to perform various functions discussed herein. The programmable control instrument (10) is more generally a "processor" or a "controller," which employs one or more microprocessors that may be programmed using software (e.g., microcode) to perform various functions discussed herein. Notably, the programmable control instrument (10) may be implemented with or without employing a processor, and also may be implemented as a combination of dedicated hardware to perform some functions and a processor (e.g., one or more programmed microprocessors and associated circuitry) to perform other functions. In addition to FPGAs, examples of programmable control instrument (10) and its components that may be employed in various embodiments of the present disclosure include, but are not limited to, conventional microprocessors, microcontrollers, application specific integrated circuits (ASICs), and field-programmable gate arrays (FPGAs).

More generally, the components of the programmable control instrument (10) that may be employed may be associated with one or more storage media (generically referred to herein as "memory," e.g., volatile and non-volatile computer memory such as random-access memory (RAM), read-only memory (ROM), programmable read-only memory (PROM), electrically programmable read-only memory (EPROM), electrically erasable and programmable read only memory (EEPROM), universal serial bus (USB) drive, floppy disks, compact disks, optical disks, magnetic tape, etc.). In some implementations, the storage media may be encoded with one or more programs that, when executed on the programmable control instrument (10), perform at least some of the functions discussed herein. Various storage media may be fixed within the programmable control instrument (10) or may be transportable, such that the one or more programs stored thereon can be loaded into a processor or controller so as to implement various aspects of the present teachings discussed herein. The terms "program" or "computer program" are used herein in a generic sense to refer to any type of computer code (e.g., software or microcode) that can be employed to program the programmable control instrument (10).

The static logic FPGA (34) implements all the functions necessary to control the fixed hardware (20), for example: communication PCIe (interconnection of components Peripheral Express, from the English 'Periferal Component Interconnect Express'), DMA ('Direct Memory Access'), RMA (Random Memory Access) and non-volatile, ADCs ("Analogue to Digital Converters) and DACs ("Digital to Analogue Converters"), etc. The static logic FPGA (34) also carries important functions for the specific performance of the instrument. For example, in a generation tool, analog signals, static logic FPGA (34) can understand the functionality of generation of periodic signals, generation of arbitrary signs, modulators, filters, etc. The static logic FPGA (34) implements the functions that tend to have very stringent performance requirements and that they require for their implementation complex advanced tools, such as, for example, DDR3 memory interfaces with transfer rates of tens of GigaBytes per second or PCI Express interfaces of several GigaBytes per second. This type of functionality requires the use of frequencies of working and sizes of data very high and very complex logic that an expert analysis to low level required for proper operation.

Figure 2:
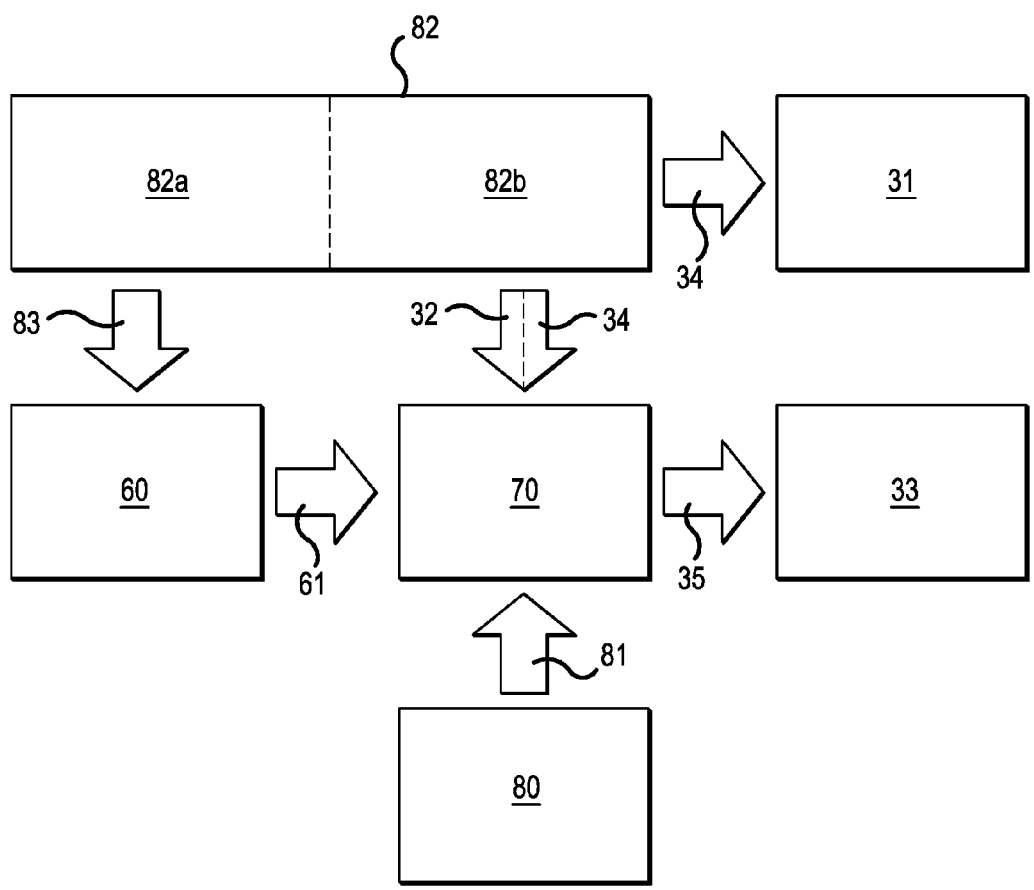
FIG. 2 is a block diagram of a configuration system of programmable control instruments, as well as of the information exchanged between these blocks, according to a representative embodiment.
Figure 3:
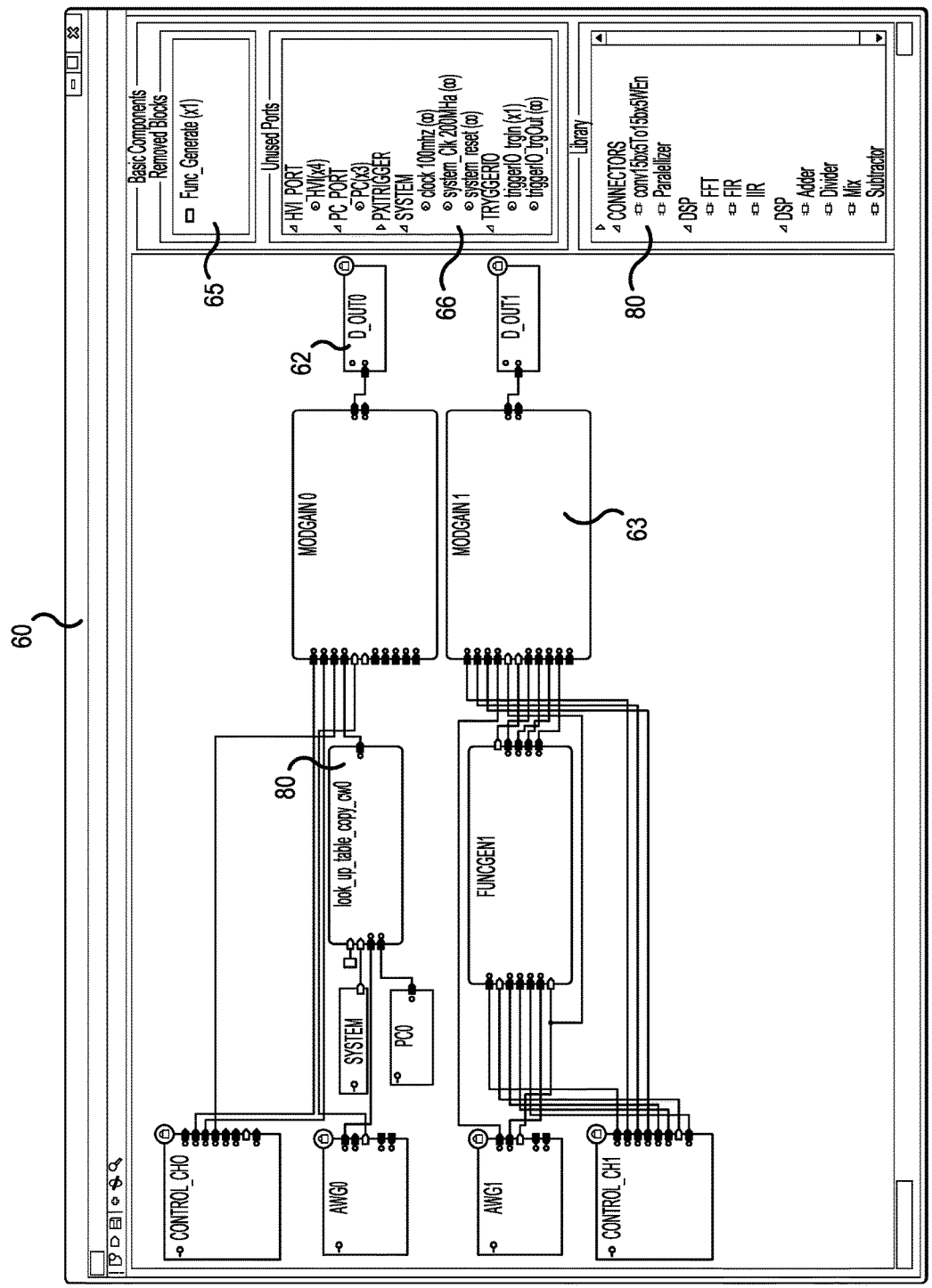
FIG. 3 depicts a user interface according to a representative embodiment.

FIG. 2 presents in more detail the elements of the system involved in the programming of the dynamic section (33). The user enters instructions and functions high level which form the user code (61) through a user interface (60). User interface (60) includes a static profile (83) on which the user implements user code (61). Illustratively the user selects from a static profiles library (82a) that you want to use depending on the options of each instrument specific. The library of static profiles (82a) is part of the hardware profiles library (82) that also includes the library of logic FPGA static (82b), which includes static logic FPGA (34) and logical interface (32) corresponding to each static profile (83). The Hardware profiles library (82) includes one or more hardware profiles for each instrument. Each hardware profile is composed of static profile (83) and its corresponding static logic FPGA, which in turn defines a logical interface (32). The static profile (83) consists of a simplified description of the static logic FPGA, which captures their features and incorporates the logical interface (32) for the user implements (61) user code and connect it to the functionalities provided by static logic FPGA (34). This user code (61) is transmitted to a server of implementation (70), combining it with a few models (81) of one or more libraries (80) to generate the dynamic logic FPGA (35) running on the dynamic section (33). The server uses the static logic FPGA (34) and the corresponding information of the logical interface (32) for the implementation of the dynamic logic FPGA (35) compatible with the static logic FPGA (34) according to the selected hardware profile. The models (81) facilitate the user programming of dynamic section (33), but contrary to the static logic FPGA, are customizable. The static logic FPGA (34) is selected to facilitate the work of programming by the user. The user interface (60) is adapted to read a dynamic code that implements the functionality of factory defaults that characterize the instrument and to make it fully functional. This serves as a base for the development of individual user code. In addition, the user interface (60) can include other elements, such as, for example, a list of dynamic blocks included per default deleted factory (65), or connection ports available (66), as well as other information that simplifies the use of the software and the development of the user code. User interface (60) can understand means of selection to allow the user to select from multiple static profiles (83) available for the instrument, as well as to configure different dynamic logic (35) and static logic FPGA (34) in the instrument. Different profiles of static logic (83) and its corresponding FPGA logic for a single instrument include various periods of high performance important for a group of applications, which require a deployment with very advanced knowledge and include them as libraries for dynamic region hinder its implementation and compromise the correct operation of the programmable control instrument (10).

The user interface (60) includes standard buses and also specific buses for each instrument, which gather signals and complex data in a single connection to simplify and accelerate the development of the code by the user. Among the standard buses are connections AXI, access memory, etc., while the specific buses depend on the data that generates and processes each instrument. Thus, for example modules of acquisition or generation of signals from several hundred megahertz to gigahertz require the use of techniques of stopping data to be able to be handled within the FPGA, these techniques extremely complicated programming of the instruments. Through the use of specific buses the user can manipulate the data without this complexity as both bookcase factory blocks include specific interfaces for these buses and manipulate complex data natively and transparent to the user as a single signal. User interface (60) may include additional features such as a validation code or latency calculation. With latency of each block, the software information displays rapidly during the delays in different connections of the diagram, as well as adjust such delays very easily in diagrams with multiple blocks. User interface (60) can understand the user code simulation capabilities to incorporate models of static and dynamic blocks and allow make simulation of behavior and display signals at different points of the diagram. Also the UI (60) may allow the user to generate a virtual instrument the system recognizes as a real tool, user software can interact with the virtual instrument as if it were a real one with the FPGA logic of user already implemented and configured in the instrument. In this way the user can simulate the generating operation of the instrument in the application of control, test and measurement with real stimuli that will receive the actual instrument but with greater control and visualizing the information simulation anywhere in the diagram without implementing the user logic and the additional logic of debugging in the instrument real, which usually requires time, requiring the implementation of FPGA logic and In addition hardware debugging capabilities tend to have more limited than the simulations. UI (60) can understand features of debugging that allows Add points for debugging or validation-(debugging) hardware, for which the software automatically generates the necessary hardware logic. Generated once such points of debugging, the software gets (10) information instrument of cleansing through any of the available on the instrument communication buses (e.g. PCI Express), and showing through the UI (60). Static section (31) can understand specific static profiles features specific to performing such purification. Once user has completed its design through the UI (60), software generates dynamic logic FPGA (35) only for the dynamic section (33) and the logical interface (32) that defines the interconnections between the dynamic section (33) and the static logic FPGA (34).

The software first processes and validates the user code (61) of locally and then sends it to the server implementation (70) for the generation of the dynamic logic (35) and the corresponding partial reconfiguration of the dynamic section (33). Before proceeding to the implementation on the server implementation (70), the software locally validates the performance of user code, your interconnection with the static logic FPGA and verifies that the resources used are available in the dynamic section (33). The server implementation (70) connects the code of user already processed locally with the possible connections files blocks libraries (80), generating a partial configuration file for the dynamic section (33) compatible with the static logic FPGA (34), which reflects the positioning and interconnection of the dynamic logic FPGA (35). In the process of implementation only generates dynamic logic FPGA (35), so the time and difficulty of implementation are very inferior to the regenerate the logic of FPGA complete and also the static logic FPGA (34) of the section is not modified at all static section (31) by what remains the performance and optimizations of all the factory features. With the partial configuration file, the user can reset the dynamic section (33) FPGA (30) at any time while logical static and the rest of the module are still operating. The burden of the new partial FPGA configuration management, i.e., the configuration of dynamic logic FPGA (35) of the user in the dynamic section (33) can be make the user interface (60) or via the supplied libraries, from any other application software. Thus, you can have different previously generated dynamic configurations and load them dynamically as the application of control, test and measurement software requires different processed by hardware. FPGA partial reconfiguration information can be programmed (30) directly, in a volatile memory of the instrument or in a non-volatile memory included in the instrument for the automatic loading at startup. In addition, they can keep more a reconfiguration in memory volatile or non-volatile, allowing you to dynamically modify the selection and configuration of hardware (20) of programmable control instrument (10). The different logics FPGA static load corresponding to the different static profiles (83) can be done in a similar way to the configuration of FPGA logic dynamic, from UI (60) or via supplied libraries. In addition both the dynamic section (33) and the static section (31) can be divided into subsections so you subsections them be reprogrammed while another they are still functioning.

In view of this description and figures, the person skilled in the art can understand that the invention has been described according to some preferential realizations of the same, but that multiple variations can be introduced in these preferred realizations, without leaving the object of the invention as has been claimed.

The invention claimed is:

1. A system for hardware configuration of a programmable control instrument, test and measure that includes an integrated FPGA, the FPGA comprising: a static section comprising at least one static logic FPGA preset; a dynamic section comprising at least one dynamic logic FPGA programmable by a user; a logical interface that connects the static section and dynamic section; a user interface (UI) through which the user introduces high-level functions that form a user code and instructions for setting the dynamic section and connecting it to the static logic FPGA functions through the logical interface; and a server implementation that converts high-level function that form the user code and instructions in dynamic logic FPGA compatible with static logic FPGA and logical interface, wherein the sever implementation generates partial configuration information for setting the dynamic section.

2. The system, in accordance claim 1, wherein the dynamic section includes a plurality of dynamic logic FPGAs programmable by the user and reconfigurable during operation of the programmable control instrument and while the static section continues to operate.

3. The system's configuration, in accordance with claim 1, wherein the static section and dynamic section comprise a plurality of subsections and at least one of the subsections is reconfigurable individually by a user selection while the remaining subsections are still running.

4. The system, in accordance with claim 1, further comprising at least one hardware component for each of a plurality of instrument profiles, the hardware component configured to read the static logic FPGA, and a logical interface implemented and optimized at a factory to suit programmable control specific requirements of various test, measurement, and control applications.

5. The system, in accordance with claim 1, wherein one or more static logic FPGA and dynamic logic FPGA are stored in among volatile memory, or nonvolatile memory, or both, of the programmable control instrument.

6. The system, according to claim 5, wherein when using the nonvolatile memory, the static logic FPGA and dynamic logic FPGA dynamic are used to automatically reconfigure the programmable control instrument.

7. The system according to claim 1, wherein the comprises at least one static profile for each of a plurality of instruments, each static profile being associated with the static logic FPGA and logical interface, and wherein the static profile describes the functionalities of the static logic FPGA, in static models including a few ports for the logical interface.

8. The system, in accordance with claim 1, wherein the UI is adapted to calculate a few associated latencies to state models used in user code and display this information during development and before being implemented in a dynamic logic FPGA for the dynamic section.

9. The system, in accordance with claim 1, wherein the UI comprises specific functions of debugging the user code and read debugging information through programmable control instrument communication ports and displays the information in real time in the same UI.

10. The system, in accordance with claim 1, wherein UI includes features of simulation to implement a virtual instrument system recognized as real.

11. The system, in accordance with claim 1, wherein the UI is a graphical interface.

12. The system, in accordance with claim 1, characterized UI is a text interface.

13. The system, in accordance with claim 1, wherein comprising buses of specific data tailored to particular features of each of a plurality of programmable control instruments and that they gather data and complex signals generated by the instrument and represents them as a single signal.

14. The system, in accordance with claim 1, further comprising at least one library with a plurality of models usable by the user to develop the user code and that include interface ports for buses of data specific to each instrument that manipulate and process multiple data and signals of specific buses as only one signal.

15. The system, in accordance with the claim 1, wherein that the server implementation is integrated into an editing software that includes the UI.

16. The system, in accordance with the claim 1, wherein that the server implementation is integrated into a remote software.

17. The configuration, according to the claim 16 system, wherein that remote software provides deployment in cloud services.

* * * * *